(12) United States Patent
Sanasi (10) Patent No.: US 9,543,034 B2
(45) Date of Patent: Jan. 10, 2017

(54) NON-VOLATILE MEMORY AND A METHOD OF OPERATING THE SAME

(71) Applicant: SK hynix Inc., Gyeonggi-do (KR)

(72) Inventor: Alessandro Sanasi, Agrate Brianza (IT)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 15/165,787

(22) Filed: May 26, 2016

(65) Prior Publication Data

US 2016/0351272 A1 Dec. 1, 2016

(30) Foreign Application Priority Data

May 27, 2015 (IT) .................. 10201518428

(51) Int. Cl.
| | | |
|---|---|---|
| G11C 16/04 | (2006.01) | |
| G11C 16/34 | (2006.01) | |
| G11C 16/10 | (2006.01) | |

(52) U.S. Cl.
CPC ........... *G11C 16/3459* (2013.01); *G11C 16/10* (2013.01)

(58) Field of Classification Search
CPC .................................................... G11C 16/04
USPC ....................................... 365/185.01–185.33
See application file for complete search history.

(56) References Cited

U.S. PATENT DOCUMENTS

| | | | | |
|---|---|---|---|---|
| 8,514,630 B2* | 8/2013 | Huynh | ............... | G11C 29/02 |
| | | | | 365/185.21 |
| 8,730,722 B2* | 5/2014 | Koh | ............... | G11C 11/5628 |
| | | | | 365/185.03 |
| 2010/0315880 A1 | 12/2010 | Joo | | |
| 2011/0051514 A1 | 3/2011 | Han et al. | | |
| 2012/0008410 A1* | 1/2012 | Huynh | ............... | G11C 29/02 |
| | | | | 365/185.21 |
| 2013/0229868 A1* | 9/2013 | Koh | ............... | G11C 11/5628 |
| | | | | 365/185.03 |
| 2014/0085985 A1* | 3/2014 | Pan | ............... | G11O 5/145 |
| | | | | 365/185.18 |

OTHER PUBLICATIONS

The Extended search report issued by the Italian Patent and Trademark Office on Jan. 29, 2016.

* cited by examiner

*Primary Examiner* — Harry W Byrne
(74) *Attorney, Agent, or Firm* — IP & T Group LLP (57) ABSTRACT

A non-volatile memory includes a current sensing checking block including a programming status input block comprising a plurality of sub-blocks connected with each other in parallel with respect to a first node; a reference block comprising a plurality of sub-blocks connected with each other in parallel with respect to a second node; an operational amplifier operable to compare voltage levels of the first node and the second node to determine whether a actual number of programming failures for a desired group of cells exceeds a reference number of allowable programming failures of the reference block.

15 Claims, 8 Drawing Sheets

NON-VOLATILE MEMORY AND A METHOD OF OPERATING THE SAME

CROSS-REFERENCE TO RELATED APPLICATION

The present application claims priority to Italian patent application No. 102015000018428 filed on May 27, 2015, which is incorporated herein by reference in its entirety.

BACKGROUND

1. Field

The present disclosure relates generally to a semiconductor memory device, and, more particularly, to a non-volatile memory device and a method thereof capable of verifying programming of a desired group of cells. The non-volatile memory device includes a current sensing checking block for verifying programming of a desired group of cells of a memory array. The current sensing checking block may be a compensated current sensing checking block.

The disclosure also relates to a memory device and method for compensating mismatch of resistances and internal offset of an operational amplifier.

2. Description of the Related Art

Among the various types of flash memory devices, NAND-type flash memory devices are increasingly used as high capacity data storage media. Each cell of a flash memory is programmed to store information by trapping electrons in a floating gate. The programming operation is performed by driving a high current through the drain and source of the cell while driving a programming voltage to the control gate of the cell, an operation known as hot electron injection. The control gate is connected to a word-line of the flash memory, and voltage is provided to the control gate through the word-line.

Each memory cell can store a single bit which is referred to as a single level memory cell (SLC), or alternatively, each cell can store multiple bits which is referred to as a multiple level memory cell (MLC). In both of the SLC and the MLC, the information stored in each cell is defined by a corresponding threshold voltage of the memory cell.

There is also the NOR-type flash memory. The main difference between NAND-type and NOR-type flash memories is that the NAND-type memory requires cells in the same string being serially connected with each other by drain and source while each cell of a NOR-type flash memory is directly connected to the bit-line and to the source line.

Figure 1:
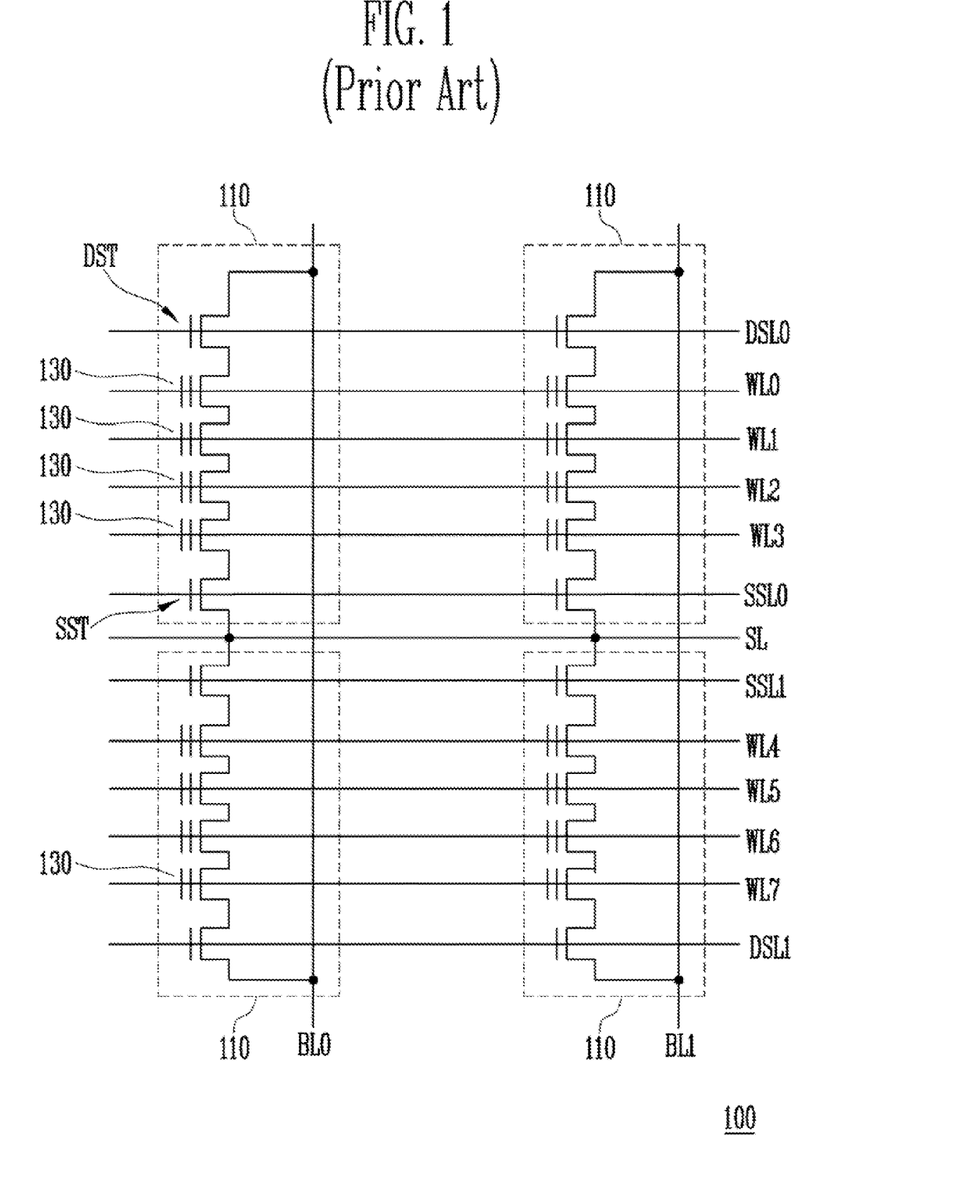
FIG. 1 schematically shows an exemplary arrangement of cells, string, word-lines and bit-lines of a conventional NAND type flash memory.

FIG. 1 schematically shows an exemplary arrangement of cells, string, word-lines and bit-lines of a NAND type flash memory.

In FIG. 1, there are shown four strings 110 in total in a main memory array of the NAND type flash memory. Each string 110 includes four cells 130. Each cell can store one-bit or several bits of information in its floating gate as explained above for the SLC or the MLC. In each string, the drain of one cell is connected to the source of another cell. The drain selection transistor DST and the source selection transistor SST can be used to address the cells. Each bit-line BL0 or BL1 is connected to the DST of each string.

The word-lines WL0 to WL7 indicate the selected page for the programming, which the voltage pulse is applied to, having amplitude characteristics and duration of a typical programming phase. The bit-line BL0 or BL1 is in particular the electrical connection between the cell and the reference page buffer (not illustrated).

Programming operation can be performed in different modes. One mode to program a desired cell is using the incremental step pulse program (ISPP). The ISPP scheme drives an incremental pulse with a specific period on the control gate of the desired cell through the corresponding word-line. The ISPP scheme can improve the correction and speed of the programming operation. Another programming algorithm other than the ISPP can also be used.

After each programming operation is terminated or each pulse of the ISPP is driven to the cell, it can be verified whether programming for a certain address page is successful or not. Based on the result of the verification, a controller can determine whether to proceed with the programming of other memory cells (i.e., other addresses) or to continue to program the same cells by applying a pulse with different electrical characteristics (e.g., greater width).

The verify operation is performed by pre-charging the bit-line BL0 or BL1 to a known voltage value VPRE and applying a voltage of "verification" to the word-line. For example, when the cells of the word-line WL1 are to be verified, the voltage value VPRE is driven to WL1. Non-addressed word-lines WL0, WL2 and WL3 are driven a pass-voltage during reading.

When the memory cell is programmed and then its relative electrical threshold has been changed to a higher value, the corresponding bit-line will not discharge and will be maintained at the voltage value VPRE, since the "verification" voltage is lower than the threshold voltage and thus not able of switching on the corresponding cell. The charged amount may diminish by a small amount due to intrinsic leakage.

When the memory cell is not programmed, the corresponding bit line will tend to discharge to a value tending to zero since the threshold voltage of the corresponding cell is low and by driving the "verification" voltage to the corresponding cell switches on. The other cells in the same string are switched on by the pass voltage provided to their control gate. The voltage of the bit-line is discharged to the source line SL connected to the source of the source selection transistor SST.

Figure 2:
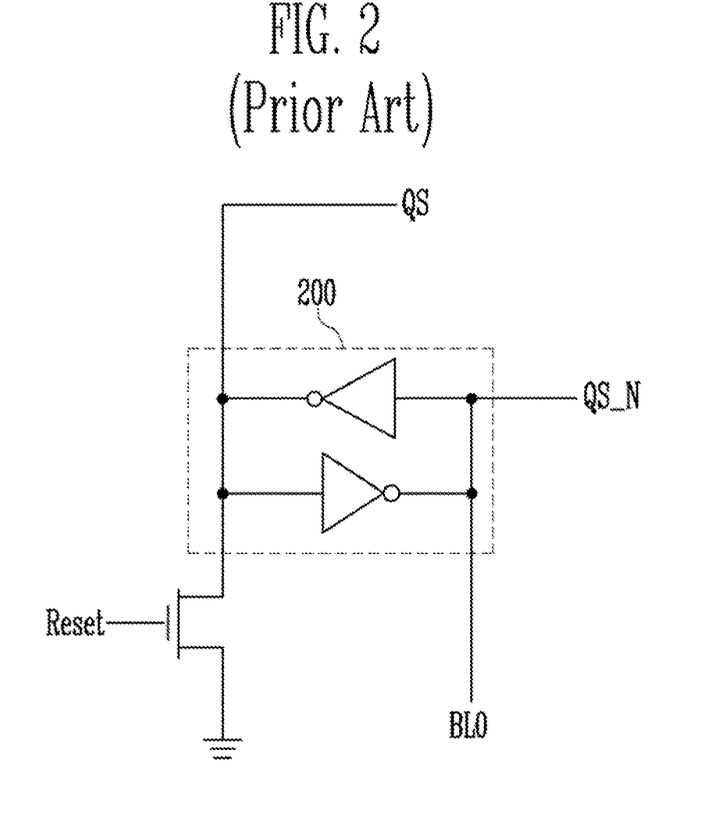
FIG. 2 schematically illustrates a conventional latch in a page buffer storing programming status information of a corresponding cell.

FIG. 2 schematically illustrates a latch 200 in the page buffer storing the programming status information of the corresponding cell. The discharge of the bit lines BL0 and BL1 is detected by the latch 200, inside the page buffer, which switches and imposes two stable states at the two sides of the latch 200. The latch 200 may include two inverters in feedback to one another and the two nodes in common are identified with QS and QS_N.

When the cell is programmed after the verification operation, the corresponding bit-line does not discharge as explained above. So, the node QS_N is set as the supply voltage VDD or higher. The node QS is set as the ground voltage. When the cell is not programmed after the verification operation, the corresponding bit-line discharges as explained above. So, the QS_N is set as the ground voltage. The QS is set as the supply voltage VDD.

The programming verification also includes counting the number of programming failures so as to determine whether the number of programming failures is tolerable or not by comparing it with a reference number of allowable failures. In particular, the reference number of allowable failures may correspond to the maximum number of errors that can be corrected by an error correction system included the memory.

For performing a programming verification operation, we have found out that it is preferable to implement a dedicated logic block, hereinafter referred to as a current sensing checking block. Due to the difference of physical layouts between the page buffer realized within the memory area and the dedicated logics realized within the peripheral area, the aforementioned comparison may not be performed adequately correctly and compensation of the current sensing checking block may be needed.

SUMMARY

Embodiments of the invention are directed to a method and circuit for compensating the current sensing checking block of a non-volatile memory capable of removing mismatch of resistances between the page buffer area and a reference block.

In an embodiment of the invention, a non-volatile memory may include: a memory array; and a current sensing checking block suitable for verifying a programming of a desired group of cells of the memory array by comparing an actual number of programming failures with a reference number of allowable programming failures, wherein the current sensing checking block includes: a current mirror; a programming status input block including a plurality of sub-blocks, each sub-block being provided with a programming status information for each bit-line for the desired group of the cells, the sub-blocks being connected with each other in parallel with respect to a first node, the first node being coupled to the input node of the current mirror; a reference block including a plurality of sub-blocks, each sub-block being provided with a 1-bit voltage value based on the reference number of allowable programming failures, the sub-blocks being connected with each other in parallel with respect to a second node, the second node being coupled to the output node of the current mirror; an operational amplifier operable to compare voltage levels of the first node and the second node to determine whether the actual number of programming failures for the desired group of cells exceeds the reference number of allowable programming failures of the reference block; a first switched capacitor operable to couple the first node to a first input node of the operational amplifier and to a ground voltage; and a second switched capacitor operable to couple the second node to a second input node of the operational amplifier and to the ground voltage as well as to couple the output node to the second input node of the operational amplifier.

In an another aspect of the embodiment, a method for operating the non-volatile memory may include: coupling to the first node the plurality of sub-blocks of programming status input block being equal to the reference number of allowable programming failures; storing a voltage value of the first node in a first capacitor of the first switched capacitor by coupling the first switched capacitor between the first node and the ground voltage; transferring the stored voltage value of the first capacitor to a second capacitor of the second switched capacitor by coupling the first switched capacitor between the first input node of the operational amplifier and the ground voltage and by closing the feedback path between the output node and the second input node of the operational amplifier; storing sum of the transferred voltage value and an internal voltage offset of the operational amplifier in the second capacitor of the second switched capacitor by coupling the second switched capacitor between the second input node of the operational amplifier and the ground voltage; and verifying a programming of the memory array by comparing the voltage values of the first node and second node, using the voltage stored in the second capacitor of the second switched capacitor.

BRIEF DESCRIPTION OF THE DRAWINGS

In the following, the present invention will be clarified by means of the following detailed description of embodiments of the present invention depicted in the drawings, wherein equivalent and/or corresponding features are identified by the same reference numerals and/or signs; in particular, in the drawings.

DETAILED DESCRIPTION

Exemplary embodiments of the present invention will be described in detail below with reference to the accompanying drawings. While the present invention is shown and described in connection with exemplary embodiments thereof, it will be apparent to those skilled in the art that various modifications can be made without departing from the spirit and scope of the invention.

In addition, detailed descriptions of constructions well known in the art may be omitted to avoid unnecessarily obscuring the gist of the present invention.

It will be understood that, although the terms "first", "second", "third", and so on may be used herein to describe various elements, these elements are not limited by these terms. These terms are used to distinguish one element from another element. Thus, a first element described below could also be termed as a second or third element without departing from the spirit and scope of the present disclosure.

It will be further understood that when an element is referred to as being "connected to", or "coupled to" another element, it can be directly on, connected to, or coupled to the other element, or one or more intervening elements may be present. In addition, it will also be understood that when an element is referred to as being "between" two elements, it can be the only element between the two elements, or one or more intervening elements may also be present.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises", "comprising", "includes", and "including" when used in this specification, specify the presence of the stated elements but do not preclude the presence or addition of one or more other elements. As used herein, the term "and/or" includes any and all combinations of one or more of the associated listed items.

Unless otherwise defined, all terms including technical and scientific terms used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In the following description, numerous specific details are set forth in order to provide a thorough understanding of the present disclosure. The present disclosure may be practiced without some or all of these specific details. In other instances, well-known process structures and/or processes have not been described in detail in order not to unnecessarily obscure the present disclosure.

Hereinafter, the various embodiments of the present disclosure will be described in details with reference to attached drawings.

In the drawings, corresponding features are identified by the same reference numerals.

Figure 3A:
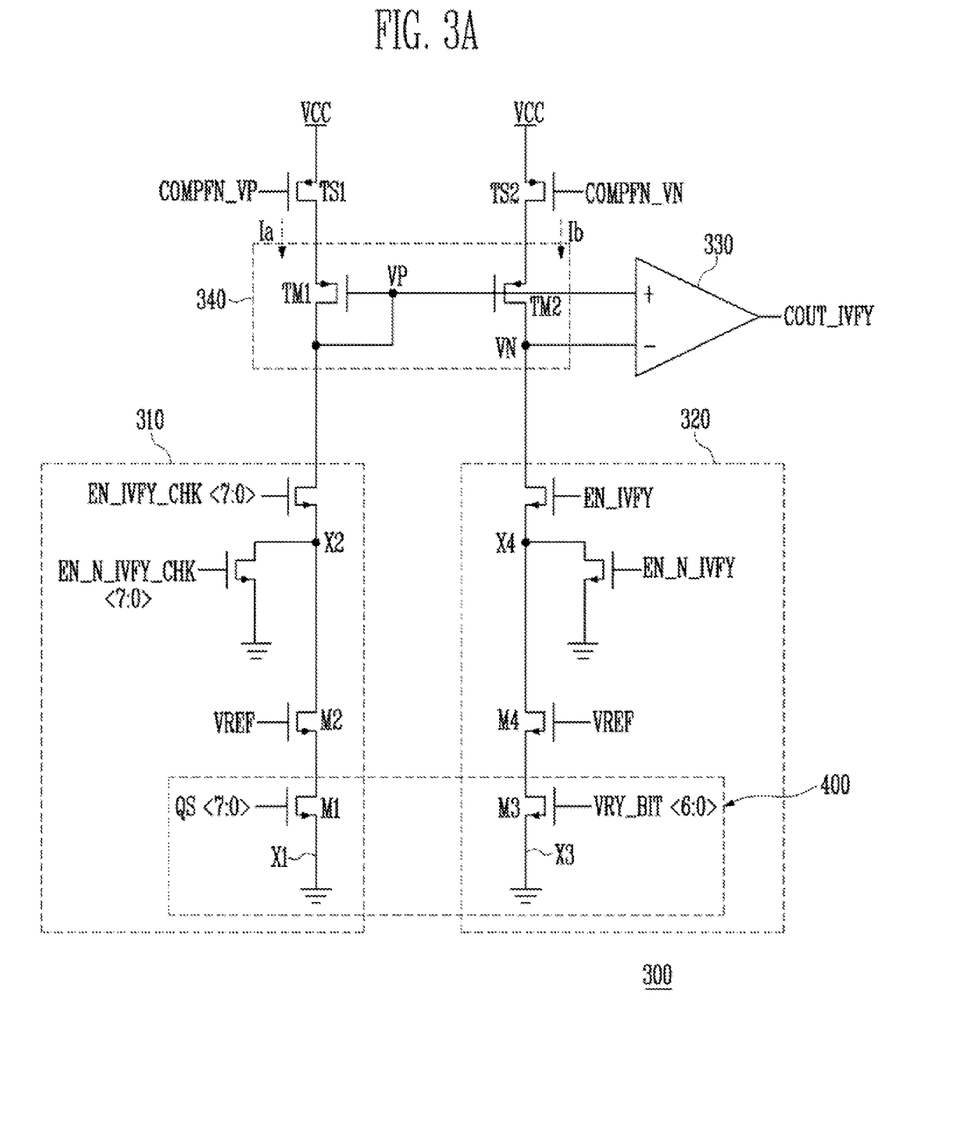
FIG. 3A shows a circuit block diagram of a current sensing checking block of a non-volatile memory for counting the number of programming failures of a desired group of cells, according to an embodiment of the present invention.

FIG. 3A shows a block diagram of a current sensing checking block 300 of a non-volatile memory for counting a number of programming failures of a desired group of cells and thus verifying the programming of the memory array.

The current sensing checking block 300 includes a programming status input block 310, a reference block 320, a current mirror 340, and an operational amplifier 330. The programming status input block 310 is provided with programming status information QS associated with each corresponding bit-line or cell. Each bit of the programming status information QS denotes the status of programming of a specific cell, and has a logical value of 0 or 1 representing the supply voltage VDD or the ground voltage. In particular, the programming status input block 310 may include a plurality of sub-blocks, and this specific configuration will be explained later.

The current mirror 340 is coupled with the programming status input block 310 through a first node VP. The input current Ia flowing downward from a left PMOS transistor TM1 of the current mirror 340 to programming status input block 310 is replicated to a right PMOS transistor TM2 coupled to a second node VN. The amount of the replicated current Ib can be identical or proportional to the amount of the input current Ia.

The reference block 320 may receive a reference number of allowable programming failures VRY_BITT <6:0> as an input. The reference number is set based on the maximum programming failures tolerated for a specific group of cells. This reference number can be varied depending on the circumstances.

The voltage of the second node VN varies based on the reference number of allowable programming failures VRY_BITT <6:0> of the reference block 320 or on the number of connected sub-blocks 320-1 to 320-4 of the reference block 320, and on the current Ib flowing through the second node VN. That is to say, the current Ib depends on the current Ia, and the equivalent resistance of the reference block 320 influences the voltage of the second node VN.

The operational amplifier 330 receives the voltage of the first node VP on its non-inverting input node and the voltage of the second node VN on its inverting input node. The operational amplifier 330 acts as a comparator of the voltages of nodes VP and VN, and is capable of providing an output signal COUT_IVFY by determining whether the actual number of programming failures for a desired group of cells exceeds the reference number of allowable programming failures of the reference block or not.

Based on the output signal COUT_IVFY of the operational amplifier 330, a controlling logic can determine whether to change programming algorithm or pulse with of programming, as previously explained.

Figure 3B:
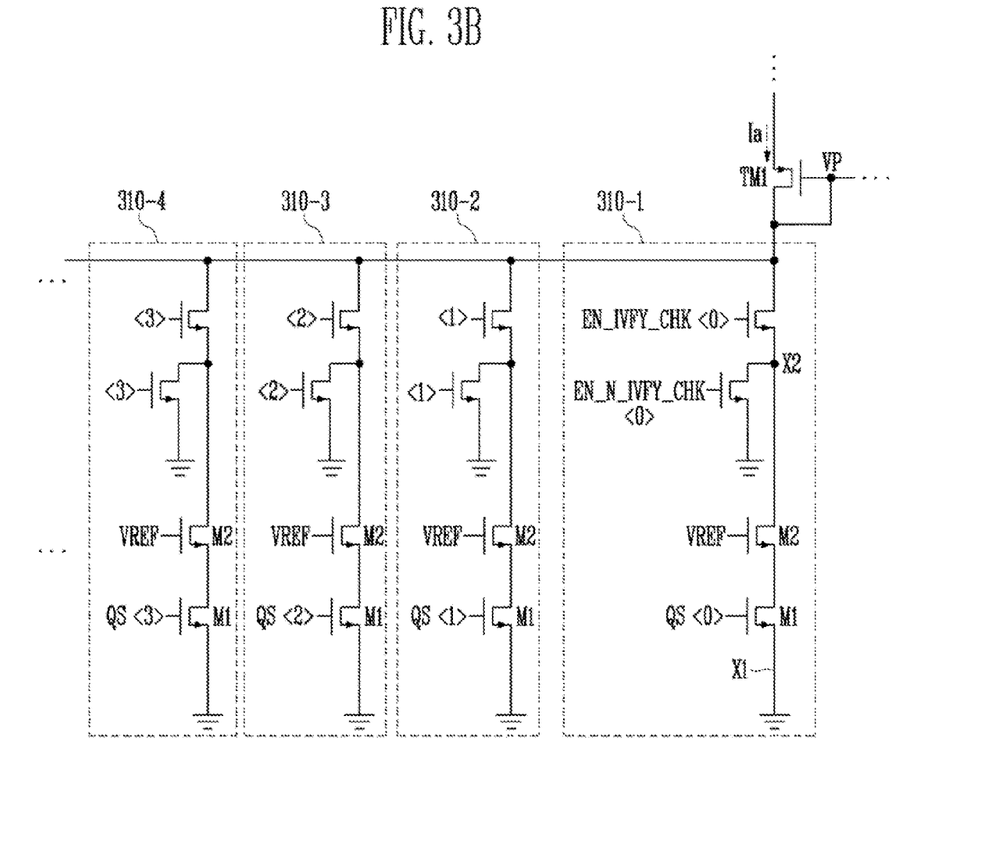
FIG. 3B shows a detailed circuit block diagram of a programming status input block of FIG. 3A, according to an embodiment of the present invention.
Figure 3C:
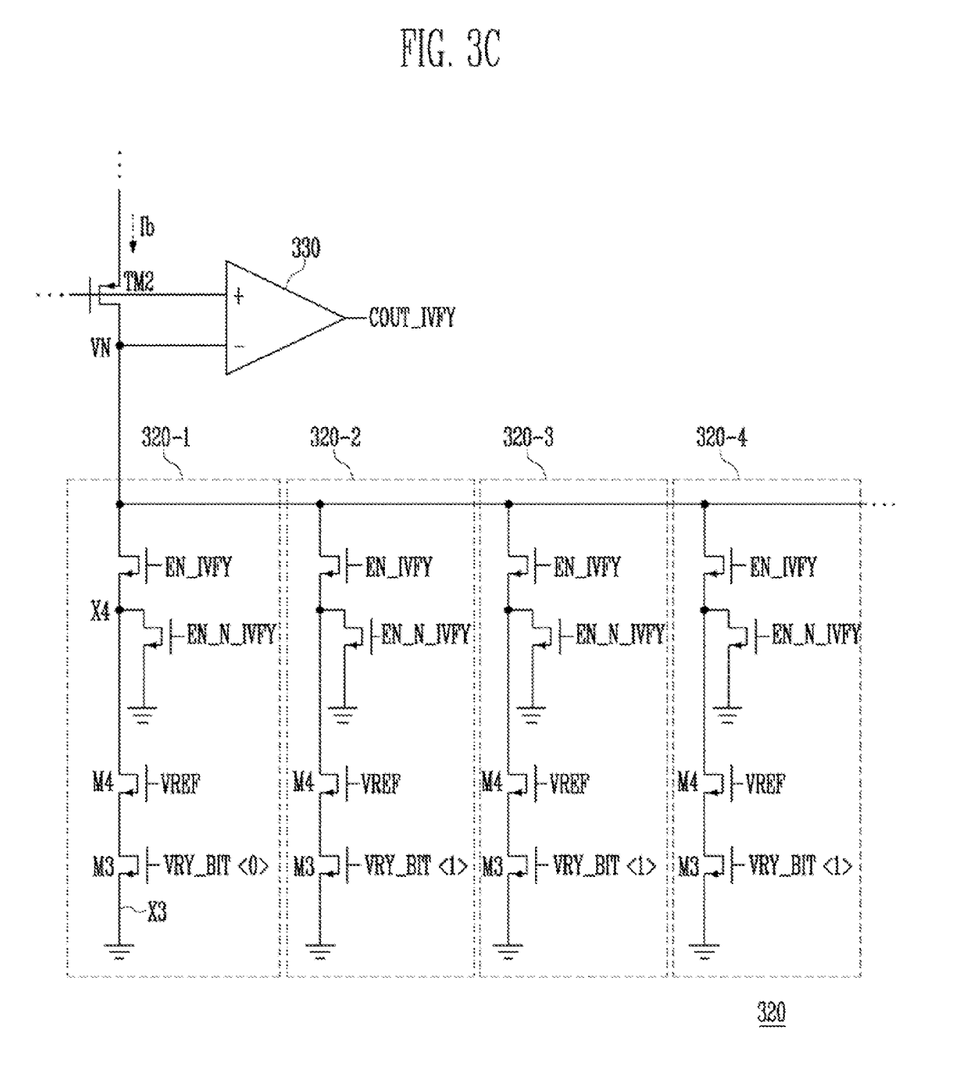
FIG. 3C shows a detailed circuit block diagram of a reference block of FIG. 3A, according to an embodiment of the present invention.

The current sensing checking block 300 of FIG. 3A is explained in more details with reference to FIG. 3B and FIG. 3C. FIG. 3B shows a detailed circuit block diagram of the programming status input block 310 of FIG. 3A, and FIG. 3C shows a detailed circuit block diagram of the reference block 320 of FIG. 3A.

In FIG. 3B, the programming status input block 310 includes a plurality of sub-blocks 310-1 to 310-4, and each sub-block is provided with 1 bit programming status information QS. For example, a first sub-block 310-1 receives a first programming status information bit QS<0> as an input, a second sub-block 310-2 receives a second programming status information bit QS<1> as an input, a third sub-block 310-3 receives a third programming status information bit QS<2> as an input and a fourth sub-block 310-4 receives a fourth programming status information bit QS<3> as an input. In the example, each bit of the programming status information QS is set as representing ground voltage when the corresponding cell is programmed, while each bit of the programming status information QS is set as representing the supply voltage VDD when the corresponding cell is not programmed, for example, as explained in FIG. 2. The programming status information QS in FIG. 2 is an example for ease of explanation. The programming status information QS here is not necessarily the latch output of FIG. 2, but is a flag indicating whether the programming is completed properly or not. For example, when a cell stores multiple bits in the MLC flash memory, the programming status information QS can be obtained with different logics.

Each of the sub-blocks 310-1 to 310-4 of the programming status input block 310 may include a first NMOS transistor M1. The source of the first NMOS transistor M1 is coupled to the ground voltage at a first internal node X1. The gate of the first NMOS transistor M1 is provided with 1-bit programming status information QS for the corresponding cell. In this way, the first NMOS transistor M1 switches on when the programming status information QS represents the supply voltage VDD (i.e., when the corresponding cell is not programmed). On the contrary, the first NMOS transistor M1 switches off when the programming status information QS represents the ground voltage (i.e., when the corresponding cell is programmed).

Each of the sub-blocks 310-1 to 310-4 of the programming status input block 310 may further include a second NMOS transistor M2. The source of the second NMOS transistor M2 is coupled to the drain of the first NMOS transistor M1. The gate of the second NMOS M2 is provided with a reference voltage VREF.

The value of such a reference voltage VREF is chosen in such a way that the second NMOS transistor M2 acts as a current generator connected to the first node VP, drawing a current amount from the left PMOS transistor TM1 of the current mirror 340.

Each of the sub-blocks 310-1 to 310-4 of the programming status input block 310 may further include an enabling block between the drain (i.e., a second internal node X2) of the second NMOS transistor M2 and the first node VP.

In FIG. 3B, the enabling block includes two transistors whose gates are driven by EN_IVFY_CHK<n> and EN_N_IVFY_CHK<n>, respectively. The enabling block can connect or disconnect a corresponding sub-block from the first node VP, and can discharge any voltage at the drain of the second transistor M2 when necessary. The enabling block disconnects the corresponding sub-block when a cell corresponding to that sub-block does not need to be programmed by the programming operation.

The current Ia at the input node of the current mirror 340 varies based on the number of connected sub-blocks 310-1 to 310-4 of the programming status input block 310. As the number of connected sub-blocks 310-1 to 310-4 increases, the current Ia also increases because the branches of sub-blocks 310-1 to 310-4 are connected with each other in parallel with respect to the first node VP.

In FIGS. 3B and 3C, there are eight sub-blocks 310-1 to 310-4 and 320-1 to 320-4 (not all being illustrated), however, we note that the number of the sub-blocks can be changed depending on the configuration, thus the embodiment is not limited thereto.

In FIG. 3C, the reference block 320 includes a plurality of sub-blocks 320-1 to 320-4 which are coupled with each other by the second node VN. Each sub-block 320-1 to 320-4 of the reference block 320 includes a third NMOS transistor M3. The source of the third NMOS transistor M3 is coupled to the ground voltage at a third internal node X3. The gate of the third NMOS transistor M3 is provided with 1-bit voltage value VRY_BIT based on the reference number of allowable programming failures. The reference number of allowable programming failures means the number of programming failures tolerable for a programming operation. Referring to FIGS. 3A and 3C, the reference number can be set from 0 to 7, as can be confirmed from VRY_BIT<6:0>. That is to say, there are totally seven sub-blocks, and by changing the value of VRY_BIT<6:0>, the reference number of allowable programming failures can be controlled. However, the maximum value of the reference number can vary depending on the design of the circuit, thus the embodiment is not limited to any specific reference number.

Each of the sub-blocks 320-1 to 320-4 of the reference block 320 may further include a fourth NMOS transistor M4. The source of the fourth NMOS transistor M4 is coupled to the drain of the third NMOS transistor M3. The gate of the fourth NMOS transistor M4 is provided with a reference voltage VREF, being the same provided to the gate of the second NMOS transistors M2. In this way, also the fourth NMOS transistors M4 act as current generators connected to the second node VN, drawing a current from the right PMOS transistor TM2 of the current mirror 340.

Each of the sub-blocks 320-1 to 320-4 of the reference block 320 may further include an enabling block between the drain (i.e., a fourth internal node X4) of the fourth NMOS transistor M4 and the second node VN.

In FIG. 3C, the enabling block includes two transistors whose gate are driven by EN_IVFY and EN_N_IVFY, respectively. The enabling block can connect or disconnect a corresponding sub-block from the first node VN, and can discharge any voltage at the drain of the fourth NMOS transistor M4 when necessary.

The current Ib at the output node of the current mirror 340 varies proportionally based on the current Ia at the input node of the current mirror 340. That is to say, the current Ib is not or hardly influenced by the configuration of the reference block 320.

The current sensing checking block 300 operates after a programming phase of a memory array. In fact, after any programming of a memory array, verification whether all memory cells are duly programmed should be made. The current sensing checking block 300 performs such a program verification by comparing the voltage values of the first node VP and of the second node VN coupled to the input nodes of the operational amplifier 330.

In particular, the reference voltage VREF is applied to the gate of the second NMOS transistors M2 of the programming status input block 310 and, on the basis of the latch values of the programming status information QS applied to the gate of first NMOS transistors M1, the amount of the current drawn from the second NMOS transistors M2 of the sub-blocks 310-1 to 310-4 of the programming status input block 310 is compared to the amount of current drawn by the fourth NMOS transistors M4 of the reference block 320, which current depends on the maximum number of the allowable programming failures.

In particular, the current sensing checking block 300 is provided for the comparison between the voltage value of the first node VP and the voltage value of the second node VN, which depend from the current drawn by the connected second NMOS transistors M2 and fourth NMOS transistors M4, respectively.

In particular, when the voltages of the first node VP and the second node VN are not equal, the output signal COUT_IVFY of the operational amplifier 330 signals that the programming phase is not successful, since the number of non-programmed cells is greater than the reference number of allowable programming failures. In this case, the programming is to be repeated for the desired group of cells, for instance by using a different programming method.

On the contrary, when the voltages of the first node VP and the second node VN are equal, the output signal COUT_IVFY of the operational amplifier 330 signals that the programming phase is successful, the number of non-programmed cells being lower than the one that can be managed by the correction system of the memory device (i.e., the reference number of allowable programming failures).

The current sensing checking block 300 can be designed such that the output signal COUT_IVFY of the operational amplifier 330 outputs negative voltage when the number of is of the programming status information QS<0:7> is greater than the number of is of the reference number of allowable programming failures VRY_BIT <6:0>, and the output signal COUT_IVFY of the operational amplifier 330 outputs positive voltage when the number of is of the programming status information QS<0:7> is less than or equal to the number of is of the reference number of allowable programming failures VRY_BIT <6:0>, for instance.

To design the current sensing checking block 300 as above, the resistance of the connecting lines needs to be considered as well. In this respect, the programming status input block 310 is arranged on the page buffer inside the memory array area, while the reference block 310 is usually arranged at the periphery area of the non-volatile memory array. The difference of physical locations of the programming status input block 310 results in different equivalent resistances in the programming status input block 310.

In particular, the first internal node X1 of the first NMOS transistor M1 of the programming status input block 310 is usually coupled to ground by a single metal contact, due to the layout restrictions of the page buffer area. This single metal contact is responsible of a very high resistance value in series with the second NMOS transistors M2 acting as current generators in the programming status input block 310. On the contrary, the third internal node X3 of the third NMOS transistors M3 of the reference block 320 can be coupled to ground by a plurality of metal contacts, thus reducing the resistance being in series with the fourth NMOS transistors M4. In fact, the layout requirements are less strict in the periphery area of the memory array, wherein the reference block 320 is realized.

Figure 4:
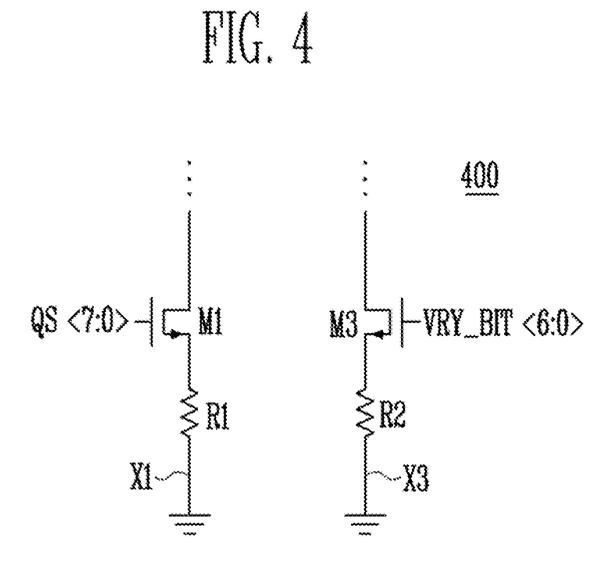
FIG. 4 is an enlarged view of the circuit of FIG. 3A.

For example, FIG. 4 is an enlarged view of the portion 400 of the circuit of FIG. 3A including the first internal node X1 and the third internal node X3 (i.e., the resistive paths due to the metal contacts toward ground). FIG. 3A is an equivalent model of the circuit of FIGS. 3B and 3C, being simplified by showing only one sub-block for the programming status input block 310 and the reference block 320. An equivalent resistance R1 at the first internal node X1 of the programming status input block 310 is really different from an equivalent resistance R2 at the third internal node X3 of the reference block 320. For example, the resistance R1$i$ may be equal to 1 KOhm, while the resistance R2 may be of 10 Ohm. The offset resulted from these resistance mismatch cannot therefore be ignored, being able to alter the results of the comparison performed by the operational amplifier 330.

In order to compensate the offset due to the resistance mismatch, a compensated current sensing checking block and program verify method is provided.

Figure 5:
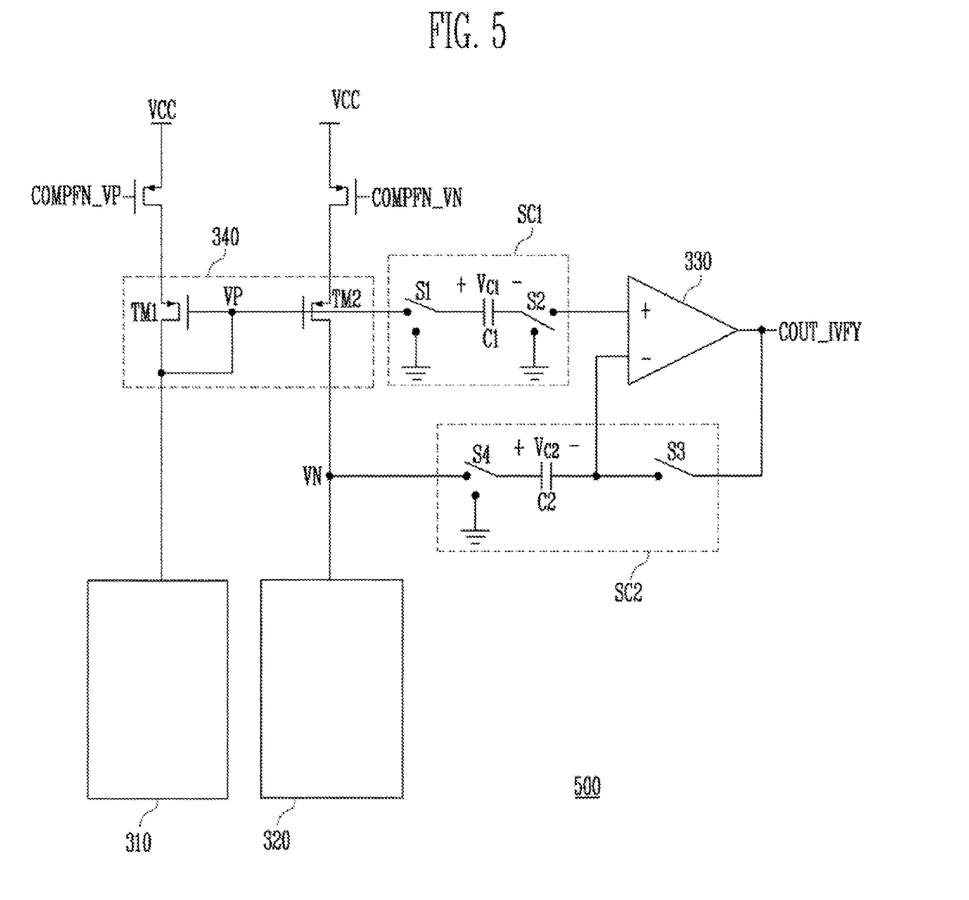
FIG. 5 schematically shows a compensated current sensing checking block performing compensation of measured nodes according to an embodiment of the present invention.

FIG. 5 schematically shows a compensated current sensing checking block 500 performing compensation of measured nodes according to an embodiment.

The compensated current sensing checking block 500 includes the elements of FIGS. 3A to 3C (i.e., the programming status input block 310, the reference block 320, the operational amplifier 330 and the current mirror 340).

The compensated current sensing checking block 500 further includes a first switched capacitor SC1, operable to couple the first node VP to the non-inverting input node of the operational amplifier 330 and to the ground voltage. The compensated current sensing checking block 500 further includes a second switched capacitor SC2, operable to couple the second node VN to the inverting input node of the operational amplifier 330 and to the ground voltage as well as operable to couple the output node to the inverting input node of the operational amplifier 330.

The first switched capacitor SC1 is operable to couple the first node VP or the ground voltage to the non-inverting input node of the operational amplifier 330 or the ground voltage, while the second switched capacitor SC2 is operable to couple the second node VN or the ground voltage to the inverting input node and optionally to the output node of the operational amplifier 330.

More particularly, the first switched capacitor SC1 includes a first capacitor C1, a first switching element S1 and a second switching element S2, while the second switched capacitor SC2 includes a second comparator C2, a third switching element S3, and a fourth switching element S4. The first node of the first switching element S1 is coupled to the first capacitor C1, and the second node of the first switching element S1 is operable to switch between the first node VP and the ground voltage.

The first node of the second switching element S2 is coupled to the first capacitor C1, and the second node of the second switching element S2 is operable to switch between the non-inverting input node of the operational amplifier 330 and the ground voltage.

The third switching element S3 is operable to switch an electric connection between the inverting input node and the output node of the operational amplifier 330.

The first node of the fourth switching element S4 is coupled to the second capacitor C2, in turn coupled to the inverting input node of the operational amplifier 330, and the second node of the fourth switching element S4 is operable to switch between the second node VN and the ground voltage.

The voltage between the nodes of the first capacitor C1 is defined as $V_{C1}$, while the voltage between the nodes of the second capacitor C2 is defined as $V_{C2}$.

Thanks to the switched capacitors SC1 and SC2 of the compensated current sensing checking block 500, the verification of the programming of a memory array is divided into the following phases.

Phase 1—Measurement of the Offset of the First Node VP Due to the Resistance of the Metal Contact of the First Internal Node X1

The programming status input block 310 is detached from the rest of the compensated current sensing checking block 500, only the left PMOS transistor TM1 of the current mirror 340 being connected thereto. The programming status information QS is applied to the gate of the first NMOS transistors M1 in such a way to turn on a number of sub-blocks 310-1 to 310-4 of the programming status input block 310 equal to the reference number of allowable programming failures and the reference value VREF is applied to the gate of the second NMOS transistors M2 in such a way to turn them on and connect them to the first node VP as a plurality of current generators in parallel one another.

It should be remarked that, in this case, the current mirror 340 acts as a voltage/current converter.

Moreover, the voltage value of the first node VP is tied to the number of second NMOS transistors M2 connected thereto, in this way equal to the reference number of allowable programming failures. The voltage difference applied to the left PMOS transistor TM1 of the current mirror 340 is then equal to the offset due to the resistance of the metal contacts toward ground of a number of connected sub-blocks 310-1 to 310-4 of the programming status input block 310 being equal to the reference number of allowable programming failures, the respective first NMOS transistors M1 and second NMOS transistors M2 being on, and thus not introducing any resistance component.

It is thus obtained a voltage value ΔRES tied to the resistive path of the page buffer area (and hence to the resistance mismatch between the page buffer area and the periphery area wherein the reference block 320 is realized), which is then stored into the first capacitor C1 as a charge being equivalent to this voltage value ΔRES. In this way, the voltage across the first capacitor C1 $V_{C1}$ is set to the voltage value ΔRES.

During this phase 1, the first switching element S1 couples the first capacitor C1 to the first node VP; the second switching element S2 couples the first capacitor C1 to the ground voltage; the third switching element S3 is open; the fourth switching element S4 couples the second capacitor C2 to the ground voltage.

Phase 2—Measurement of the Offset of the Operational Amplifier 330 and the Addition of the Offset to the Resistance Mismatch of the First Node VP The operational amplifier 330 is a physical component having an internal offset ΔOPAMP which unbalances the voltage difference as measured at its input nodes and thus the results of the verification as performed by the current sensing checking block 400 as a whole. The switched capacitors SC1 and SC2 of the compensated current sensing checking block 500 are then used also to measure and store this internal voltage offset ΔOPAMP of the operational amplifier 330.

In fact, by coupling the first capacitor C1, where the voltage value $V_{C1}$ is the voltage value ΔRES due to the resistance mismatch, through the second switching element S2 to the non-inverting input node of the operational amplifier 330 and by closing the feedback path by closing the third switching element S3, a charge corresponding to a voltage value $V_{C2}$ being equal to the sum of the voltage value ΔRES and the internal voltage offset ΔOPAMP ($V_{C2}$=ΔRES+ΔOPAMP) is thus stored into the second capacitor C2, a voltage value $V_{C2}$ being then used in order to compensate the voltage offsets due to the resistive mismatch between the programming status input block 310 of the page buffer area and the reference block 320 of the periphery area and due to the internal offset of the operational amplifier 330, respectively.

During this phase 2, the first switching element S1 couples the first capacitor C1 to the ground voltage; the second switching element S2 couples the first capacitor C1 to the non-inverting input node of the operational amplifier 330; the third switching element S3 is closed; the fourth switching element S4 couples the second capacitor C2 to the ground voltage.

It should be remarked that the above explained phases 1 and 2 are performed simultaneously with a programming of the memory array, no additional time being due. It can be said that phases 1 and 2 perform a compensation of the internal errors of the current sensing checking block 500.

Phase 3—Verification of the Programming of the Memory Array with Compensation of the Resistance Mismatch and Comparator Internal Offset This is the true verification phase and is performed after the programming of the memory array is ended. For the verification of the programming, the current mirror 340 is newly connected to the programming status input block 310 and to the reference block 320, the operational amplifier 330 now acting in an open loop as a true comparator.

In particular, the non-inverting input node of the operational amplifier 330 is coupled to the first node VP through the first switched capacitor SC1 and in particular through the first capacitor C1, which previously discharged the voltage $V_{C1}$ of the value ΔRES in phase 2, by transferring the corresponding charge into the second comparator C2 of the second switched capacitor SC2.

Moreover, the inverting input node of the operational amplifier 330 is coupled to the second node VN through the second switched capacitor SC2, in particular through the second comparator C2, the third switching element S3 being newly open, interrupting the feedback path between the output node and the inverting input node of the operational amplifier 330.

In this way, the voltage value $V_{C2}$ (=ΔRES+ΔOPAMP) as stored in the previous phase 2 into the second comparator C2, being equal to the sum of the offset ΔRES due to the resistive path of the programming status input block 310 and the offset ΔOPAMP due to the operational amplifier 330, is able to compensate these offsets and the operational amplifier 330 is able to verify the true value of the difference between the voltage of the first node VP and the voltage of the second node VN, thus verifying whether the number of non-programmed cells in the programming status input block 310 is less than the reference number of the allowable programming failures, as indicated by the sub-blocks 320-1 to 320-4 of the reference block 320 coupled to the second node VN, and thus performing a correct program verification.

During this phase 3, the first switching element S1 couples the first capacitor C1 to the first node VP; the second switching element S2 couples the first capacitor C1 to the non-inverting input node of the operational amplifier 330; the third switching element S3 is open and the fourth switching element S4 couples the second capacitor C2 to the second node VN.

It should be noted that the memory array usually includes a plurality of operational amplifiers as comparators for the current sensing checking, each operational amplifier being connected to a group of cells or bit-lines, according to an internal subdivision of the memory array. The above indicated compensations of voltage offsets due to resistance mismatches and internal offset being thus provided for each group of cells, in an independent and more precise manner.

In particular, it can be considered that a group of cells could have a more resistive pattern, due to its distance with respect to the corresponding operational amplifier and each operational amplifier could have a different internal offset, in other words, each group of cells could have different voltage values ΔRES and internal voltage offsets ΔOPAMP, which are locally and self-compensated thanks to the proposed layout and operation of the compensated current sensing checking block 500, and in particular to the provision of respective switched capacitors SC1 and SC2 and their suitable driving.

The compensated current sensing checking block 500 of FIG. 5 is thus able to implement an enhanced method for verifying the programming of a memory array by determining whether the number of programming failures of a desired group of cells exceeds the reference number of allowable programming failures, and by simultaneously compensating the voltage offsets due to the resistance mismatch between the programming status input block 310 in the page buffer area and the reference block 320 in the peripheral area as well as the internal offset of the operational amplifiers 330, such a verification being made by each group of cells having a same operational amplifier 330.

As previously explained, the verification of the programming is made on a desired group of cells having a common operational amplifier 330.

More particularly, the method includes the steps of: connecting to the first node VP a number of sub-blocks 310-1 to 310-4 of programming status input block 310 being equal to the reference number of allowable programming failures (i.e., the maximum number of errors that can be corrected by the error correction system included in the memory); storing the voltage value ΔRES of the first node VP, which corresponds to the resistance path due to the connected sub-blocks 310-1 to 310-4 of the programming status input block 310 in the first capacitor C1 of the first switched capacitor SC1 ($V_{C1}$=ΔRES) by coupling the first switched capacitor SC1 between the first node VP and the ground voltage; transferring the stored voltage value ($V_{C1}$=ΔRES) to the second capacitor C2 of the second switched capacitor SC2 by coupling the first switched capacitor SC1 between the non-inverting input node of the operational amplifier 330 and the ground voltage and by closing the feedback path between the output node and the inverting input node of the operational amplifier 330; storing the sum of the transferred voltage value ΔRES and the internal voltage offset ΔOPAMP of the operational amplifier 330, in the second capacitor C2 of the second switched capacitor SC2 ($V_{C2}=\Delta RES+\Delta OPAMP$) by coupling the second switched capacitor SC2 between the inverting input node of the operational amplifier 330 and the ground voltage; and verifying the programming of the memory array by comparing the voltage values of the first node VP and second node VN, using the voltage ($V_{C2}=\Delta RES+\Delta OPAMP$) stored in the capacitor C2 of the second switched capacitor SC2 to compensate the errors due to the resistance mismatch between the programming status input block 310 and the reference block 320 and the internal offset of the operational amplifier 330.

According to an embodiment, the step of coupling to the first node VP a number of sub-blocks 310-1 to 310-4 of programming status input block 310 being equal to the reference number of allowable programming failures includes steps of coupling only the left PMOS transistor TM1 of the current mirror 340 to the programming status input block 310; setting the programming status information QS for each bit-line of the programming status input block 310 based on the reference number of allowable programming failures of the reference block 320; and applying a reference value VREF to the gate of the second NMOS transistors M2 of respective blocks 310-1 to 310-4 of the programming status input block 310 in such a way to turn them on and connect them to the first node VP as a plurality of current generators in parallel one another.

Moreover, the step of storing the voltage value $\Delta RES$ of the first node VP includes steps of controlling the first switching element S1 to couple the first capacitor C1 to the first node VP, the second switching element S2 to couple the first capacitor C1 to the ground voltage, the third switching element S3 to open and the fourth switching element S4 to couple the second capacitor C2 to the ground voltage.

The step of transferring the stored voltage value ($V_{C1}=\Delta RES$) to the second capacitor C2 also includes a step of controlling the second switching element S2 to couple the first capacitor C1 to the non-inverting input node of the operational amplifier 330 and the third switching element S3 to close.

Furthermore, the step of storing the sum of the transferred voltage value $\Delta RES$ and the internal voltage offset $\Delta OPAMP$ of the operational amplifier 330 includes a step of controlling the fourth switching element S4 to couple the second capacitor C2 to the ground voltage.

Finally, the step of verifying the programming of the memory array includes a step of coupling the non-inverting input node of the operational amplifier 330 to the first node VP through the first switched capacitor SC1 and the inverting input node of the operational amplifier 330 to the second node VN through the second switched capacitor SC2.

In particular, the step of verifying the programming of the memory array may include: i) controlling the first switching element S1 to couple the first capacitor C1 to the first node VP, ii) controlling the second switching element S2 to couple the first capacitor C1 to the non-inverting input node of the operational amplifier 330, iii) controlling the third switching element S3 to open and iv) controlling the fourth switching element S4 to couple the second capacitor C2 to the second node VN. The controlling of the first, second, third and fourth switching elements S1, S2, S3 and S4 may be performed simultaneously or in a sequential manner.

The step of verifying the programming of the memory array may further include determining whether or not the number of programming failures of the desired group of cells exceeds the reference number of allowable programming failures, and when it is determined that the number of programming failures of the desired group of cells exceeds the reference number of allowable programming failures, providing a new programming of the desired group of cell.

Figure 6:
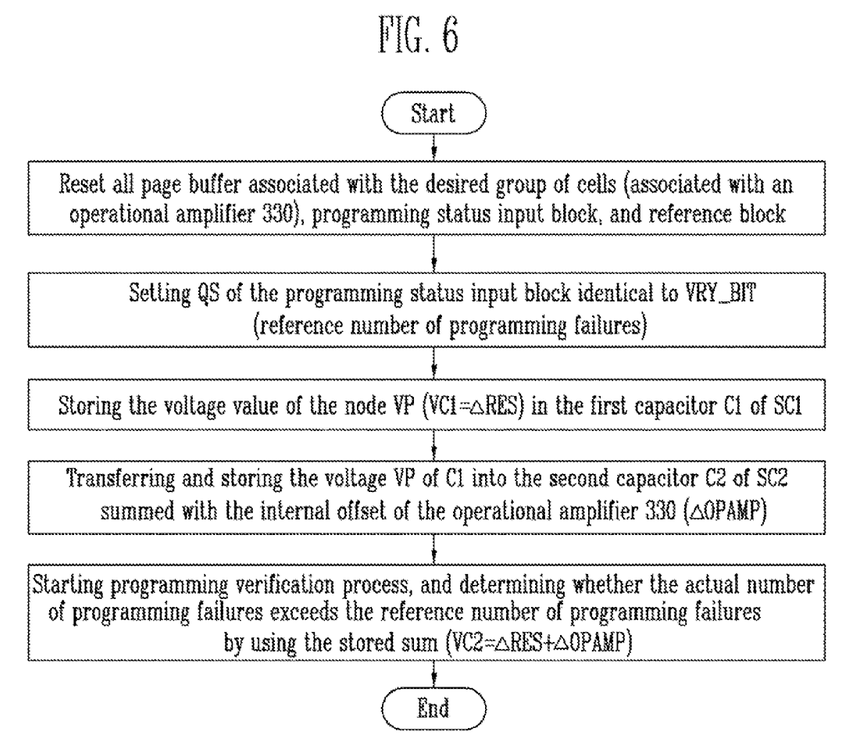
FIG. 6 schematically shows a flow chart illustrating verifying of programming of a memory array by the current sensing checking block of FIG. 5, according to an embodiment of the present invention.

FIG. 6 schematically shows a flow chart illustrating the above indicated sequences for the verification of the programming with compensation of the internal offsets (i.e., the voltage value $\Delta RES$ and the internal voltage offset $\Delta OPAMP$) by using the compensated current sensing checking block 500 of FIG. 5.

In particular, the sequence includes the following essential steps of: resetting all page buffer associated with the desired group of cells (i.e., the ones associated with the operational amplifier 330) along with the programming status input block 310 and the reference block 320; setting the programming status information QS of the programming status block 310 identical to the reference number of allowable programming failures VRY_BIT; storing the voltage value of the first node VP in the first capacitor C1 ($V_{C1}=\Delta RES$) of the first switched capacitor SC1; transferring the voltage $\Delta RES$ of the first node VP stored in the first capacitor C1 into the second capacitor C2 of the second switched capacitor SC2 along with the internal offset $\Delta OPAMP$ of the operational amplifier 330 ($V_{C2}=\Delta RES+\Delta OPAMP$); and starting the programming verification process and determining whether the actual number of programming failures exceeds the reference number of allowable programming failures, by using the stored sum ($V_{C2}=\Delta RES+\Delta OPAMP$).

According with the aforementioned method the measurement of the voltage $\Delta RES$ on the line of the first node VP is performed in determined conditions, and the obtained voltage value is used as an offset when performing the Current Sensing Check (CSC).

In particular, the measurement is made by emulating the number of allowable programming failures, by setting the reference value on the line of the first node VP and forcing a current equivalent to the number of allowable programming failures into this line.

The voltage of the first node VP includes the contribution of the resistive path, consisting of metal and contacts and the body effect of the transistors inside the page buffers connected thereto and the measured voltage $\Delta RES$ is stored in the first and second capacitors C1 and C2 (being used as a cap).

The measured voltage $\Delta RES$ is then added to the offset $\Delta OPAMP$ of the operational amplifier 330 obtained via the switching arrangement including two switched capacitors SC1 and SC2 suitably coupled to the nodes VP and VN and to the operational amplifier 330.

In this way, a true CSC measurement could be obtained by the operational amplifier 330 acting as the comparator, and advantageously according to the disclosure the stored offset ($V_{C2}=\Delta RES+\Delta OPAMP$) does compensate the mismatch of parasitic elements and non-idealities of the current sensing checking block.

It should be also remarked that no further current generator connected to the first node VP is required since the left PMOS transistor TM1 of the current mirror 340, having a low impedance, acts as a voltage/current converter by using a reference voltage value VREF applied to the gate of the second NMOS transistors M2, which acts as a plurality of current generators connected to the first node VP and thus allows to apply to the first capacitor C1 of the first switched capacitor SC1 a voltage drop $\Delta RES$ tied to the reference number of the allowable programming failures corresponding to the number of sub-blocks 310-1 to 310-4 of programming status input block 310 connected to the first node VP.

From the foregoing it will be appreciated that, although specific embodiments of the invention have been described herein for purposes of illustration, various modifications may be made without deviating from the spirit and/or scope of the invention. Accordingly, the invention is not limited except as by the appended claims.

What is claimed is:

1. A non-volatile memory comprising:
a memory array; and
a current sensing checking block suitable for verifying a programming of a desired group of cells of the memory array by comparing an actual number of programming failures with a reference number of allowable programming failures,
wherein the current sensing checking block comprises:
a current mirror;
a programming status input block comprising a plurality of sub-blocks, each sub-block being provided with a programming status information for each bit-line for the desired group of the cells, the sub-blocks being connected with each other in parallel with respect to a first node, the first node being coupled to the input node of the current mirror;
a reference block comprising a plurality of sub-blocks, each sub-block being provided with a 1-bit voltage value based on the reference number of allowable programming failures, the sub-blocks being connected with each other in parallel with respect to a second node, the second node being coupled to the output node of the current mirror;
an operational amplifier operable to compare voltage levels of the first node and the second node to determine whether the actual number of programming failures for the desired group of cells exceeds the reference number of allowable programming failures of the reference block;
a first switched capacitor operable to couple the first node to a first input node of the operational amplifier and to a ground voltage; and
a second switched capacitor operable to couple the second node to a second input node of the operational amplifier and to the ground voltage as well as to couple the output node to the second input node of the operational amplifier.

2. The non-volatile memory of claim 1,
wherein the first switched capacitor comprises a first capacitor, a first switching element and a second switching element,
wherein a first node of the first switching element is coupled to the first capacitor, and a second node of the first switching element is operable to switch between the first node and the ground voltage, and
wherein a first node of the second switching element is coupled to the first capacitor, and a second node of the second switching element is operable to switch between the first input node of the operational amplifier and the ground voltage.

3. The non-volatile memory of claim 1,
wherein the second switched capacitor comprises a second comparator, a third switching element, and a fourth switching element,
wherein the third switching element is operable to switch an electric connection between the second input node of the operational amplifier and the output node of the operational amplifier;
wherein a first node of the fourth switching element is coupled to the second input node of the operational amplifier, and a second node of the fourth switching element is operable to switch between the second node and the ground voltage.

4. The non-volatile memory of claim 1,
wherein each of the sub-block of the programming status input block comprises a first NMOS transistor,
wherein a source of the first NMOS transistor is coupled to the ground voltage, a drain of the first NMOS transistor is electrically connectable to the first node, and a gate of the first NMOS transistor is provided with the programming status information for the corresponding cell, and
wherein the programming status information is 1-bit voltage value.

5. The non-volatile memory of claim 4,
wherein each of the sub-block of the programming status input block further comprises a second NMOS transistor, and
wherein a source of the second NMOS transistor is coupled to the drain of the first NMOS transistor, a drain of the second NMOS transistor is electrically connectable to the first node, and a gate of the second NMOS transistor is provided with a reference voltage.

6. The non-volatile memory of claim 1,
wherein the current mirror comprises a first PMOS transistor and a second PMOS transistor,
wherein a drain of the first PMOS transistor is coupled to the first node and a drain of the second PMOS transistor is coupled to the second node, and
wherein the gate of the first PMOS transistor is coupled to the drain of the first PMOS transistor.

7. The non-volatile memory of claim 1,
wherein the reference block comprises a plurality of sub-blocks which are coupled with each other by the second node,
wherein each of the sub-block of the reference block comprises a third NMOS transistor,
wherein a source of the third NMOS transistor is coupled to the ground voltage and a drain of the third NMOS transistor is electrically connectable to the second node,
wherein a gate of the third NMOS transistor is provided with 1-bit voltage value derived based on the reference number of programming failure.

8. The non-volatile memory of claim 7,
wherein each of the sub-block of the reference block further comprises a fourth NMOS transistor, and
wherein a source of the fourth NMOS transistor is coupled to the drain of the third NMOS transistor, a drain of the fourth NMOS transistor is electrically connectable to the second node, and a gate of the third NMOS transistor is provided with a reference voltage.

9. A method for operating a non-volatile memory of claim 1, the method comprising:
coupling to the first node the plurality of sub-blocks of programming status input block being equal to the reference number of allowable programming failures;
storing a voltage value of the first node in a first capacitor of the first switched capacitor by coupling the first switched capacitor between the first node and the ground voltage;
transferring the stored voltage value of the first capacitor to a second capacitor of the second switched capacitor by coupling the first switched capacitor between the first input node of the operational amplifier and the ground voltage and by closing the feedback path between the output node and the second input node of the operational amplifier;

storing the sum of the transferred voltage value and an internal voltage offset of the operational amplifier in the second capacitor of the second switched capacitor by coupling the second switched capacitor between the second input node of the operational amplifier and the ground voltage; and verifying a programming of the memory array by comparing the voltage values of the first node and second node, using the voltage stored in the second capacitor of the second switched capacitor.

10. The method of claim 9 wherein the coupling of the plurality of sub-blocks of programming status input block comprises:

coupling only the input node of the current mirror to the programming status input block;

setting programming status information for each bit-line of the programming status input block based on the reference number of allowable programming failures of the reference block; and turning on selected ones of the plurality of sub-blocks of the programming status input block according to the programming status information and connecting them to the first node.

11. The method of claim 9, wherein the storing of the voltage value of the first node comprises controlling the first switched capacitor to couple the first capacitor between the first node and the ground voltage and the second switched capacitor to couple the second capacitor to the ground voltage.

12. The method of claim 9, wherein the transferring of the stored voltage value of the first capacitor to the second capacitor comprises controlling the first switched capacitor to couple the first capacitor to the first input node of the operational amplifier and the second switched capacitor to close a feedback path between the output node and the second input node of the operational amplifier.

13. The method of claim 9, wherein the storing of the sum of the transferred voltage value and the internal voltage offset comprises controlling the second switched capacitor to couple the second capacitor to the ground voltage.

14. The method of claim 9, wherein the verifying of the programming comprises controlling the first switched capacitor to couple the first capacitor to the first node and the first input node of the operational amplifier, and the second switched capacitor to open feedback path between the output node and the second input node of the operational amplifier and to couple the second capacitor to the second node.

15. The method of claim 9, wherein the phase of verifying comprises:

determining whether or not the actual number of programming failures of the desired group of cells exceeds the reference number of allowable programming failures; and when it is determined to exceed, providing a new programming of the desired group of cell.

* * * * *

UNITED STATES PATENT AND TRADEMARK OFFICE
CERTIFICATE OF CORRECTION

PATENT NO. : 9,543,034 B2
APPLICATION NO. : 15/165787
DATED : January 10, 2017
INVENTOR(S) : Alessandro Sanasi

It is certified that error appears in the above-identified patent and that said Letters Patent is hereby corrected as shown below:

On the Title Page

Item (30), change the Foreign Applications Number in the Foreign Application Priority Data section as follows:

(30) Foreign Application Priority Data
May 27, 2015 (IT) .................................. 102015000018428

Signed and Sealed this
Third Day of April, 2018

Andrei Iancu
*Director of the United States Patent and Trademark Office*